(12) United States Patent
Cariello et al.

(10) Patent No.: US 11,790,961 B2
(45) Date of Patent: Oct. 17, 2023

(54) MEMORY DEVICE ACCESS TECHNIQUES

(71) Applicant: Micron Technology, Inc., Boise, ID (US)

(72) Inventors: Giuseppe Cariello, Boise, ID (US); Luca Porzio, Casalnuovo (IT)

(73) Assignee: Micron Technology, Inc., Boise, ID (US)

( * ) Notice: Subject to any disclaimer, the term of this patent is extended or adjusted under 35 U.S.C. 154(b) by 32 days.

(21) Appl. No.: 17/692,873

(22) Filed: Mar. 11, 2022

(65) Prior Publication Data

US 2023/0290389 A1 Sep. 14, 2023

(51) Int. Cl.
  *G11C 7/10* (2006.01)
(52) U.S. Cl.
  CPC .......... *G11C 7/1063* (2013.01); *G11C 7/1039* (2013.01); *G11C 7/1069* (2013.01); *G11C 7/1096* (2013.01)
(58) Field of Classification Search
  CPC ... G11C 7/1063; G11C 7/1039; G11C 7/1069; G11C 7/1096
  See application file for complete search history.

(56) References Cited

U.S. PATENT DOCUMENTS

| | | | |
|---|---|---|---|
| 7,969,814 B2* | 6/2011 | Choi | G11C 7/1051 365/233.1 |
| 10,818,328 B2* | 10/2020 | Kim | G11C 7/22 |
| 10,884,661 B2* | 1/2021 | Tsai | G06F 3/0679 |

* cited by examiner

*Primary Examiner* — Son L Mai

(74) *Attorney, Agent, or Firm* — Holland & Hart LLP

(57) ABSTRACT

Methods, systems, and devices for memory device access techniques are described. Memory systems may be enabled to allow device-controlled access to a portion of volatile memory at a host system. By enabling the memory system to access volatile memory at the host system, the memory system may perform access operations which may reduce a quantity of messages exchanged between the memory system to the host system. The host system may allocate a list of memory resources in volatile memory associated with a first access command. The host system may allocate the same memory resources for a second access command. By allocating the same memory resources, the memory device may transmit a Ready To Transfer (RTT) message for multiple access commands, rather than for each command. In some cases, reducing the quantity of RTT messages may reduce latency and improve performance at the memory system.

25 Claims, 8 Drawing Sheets

MEMORY DEVICE ACCESS TECHNIQUES

FIELD OF TECHNOLOGY

The following relates to one or more systems for memory, including memory device access techniques.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

In some memory systems, a host device may transmit commands to a memory device. The commands may indicate a set of data stored at the memory device, and request to access the set of data (e.g., request to perform a read or write operation). In response to a command, the memory device may send a Ready To Transfer (RTT) message, which may initiate the data transfer associated with the access command. In some examples, the RTT message may indicate a status of the memory device, for example, to the host device. In some cases, one RTT message may be sent for each command received from the host device. The host device may have a relatively small amount of memory (e.g., static random access memory (SRAM)), which in some cases may be fully allocated for use by a flash translation layer (FTL). The host device may therefore rely on storage at one or more memory devices to support functionality, and may transmit and receive multiple commands associated with each access operation at a memory device. In some cases, the quantity of commands associated with each access operation may increase latency and reduce efficiency for the host system.

Systems, devices, and techniques are described to support memory device access with fewer commands, thus improving latency. For example, in some cases, memory devices may be configured to enable device-controlled access to a portion of volatile memory (e.g., dynamic random access memory (DRAM), SRAM) at the host device. By enabling the memory device to access volatile memory at the host device, the memory device may reduce the quantity of RTT messages transmitted from the memory device to the host device to perform access operations. For example, the host device may allocate a list of memory resources (e.g., a Physical Region Description Table (PRDT)) in volatile memory associated with a first access command. The host device may allocate the same PRDT for a second access command. That is, the first access command and the second access command may address a same location in the volatile memory at the host device. By allocating the same PRDT, the memory device may transmit a single RTT message in response to the first access command and the second access command, rather than for each access command. In some cases, reducing the quantity of RTT messages may reduce latency and improve performance at the memory system.

Figure 1:
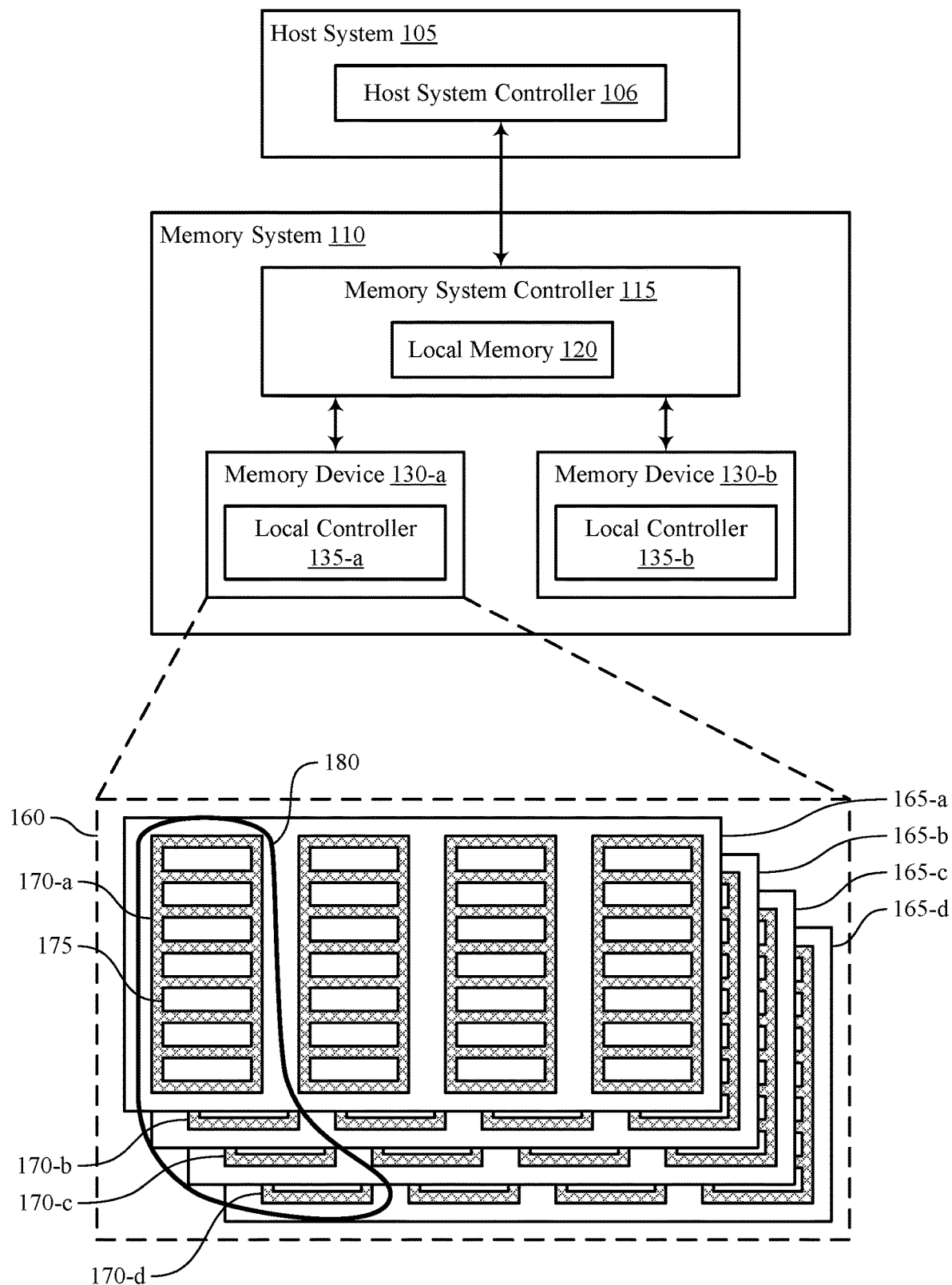
FIG. 1 illustrates an example of a system that supports memory device access techniques in accordance with examples as disclosed herein.
Figure 2:
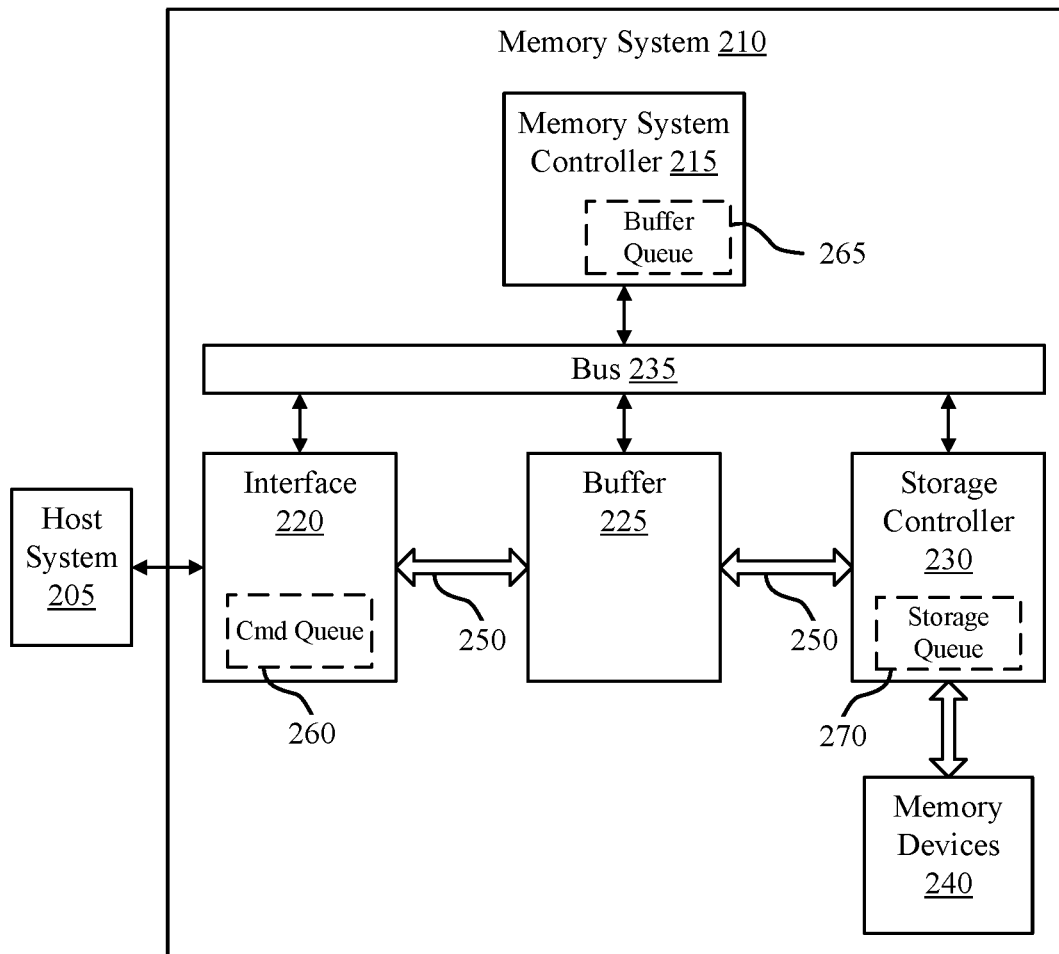
FIG. 2 illustrates an example of a system that supports memory device access techniques in accordance with examples as disclosed herein.
Figure 3:
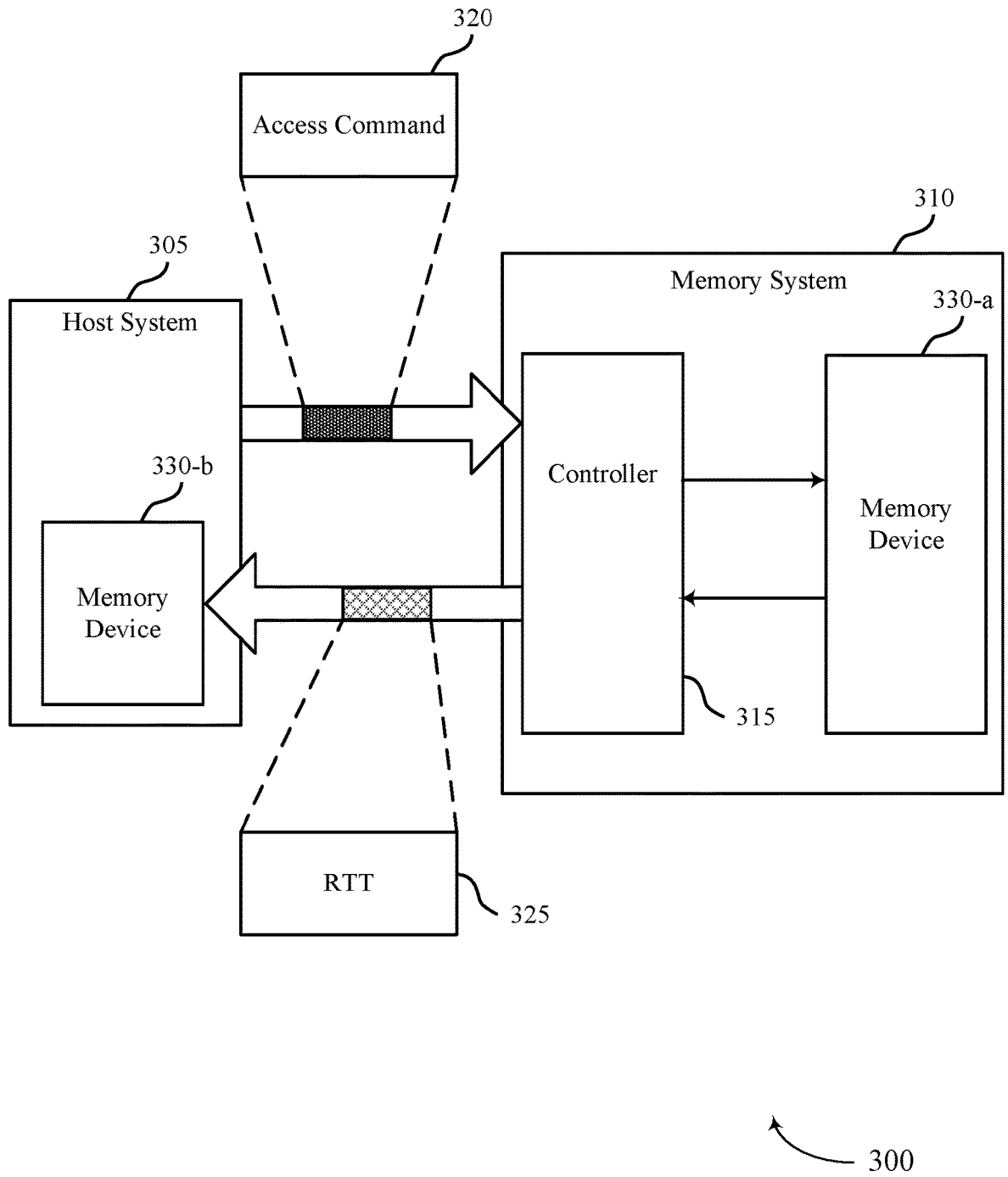
FIG. 3 illustrates an example of a system that supports memory device access techniques in accordance with examples as disclosed herein.

Features of the disclosure are initially described in the context of systems, devices, and circuits with reference to FIGS. 1 through 3. Features of the disclosure are described in the context of a process flow with reference to FIG. 4. These and other features of the disclosure are further illustrated by and described in the context of apparatus diagrams and flowcharts that relate to memory device access techniques with reference to FIGS. 5-7.

FIG. 1 illustrates an example of a system 100 that supports memory device access techniques in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include SRAM or other memory that may be used by the memory system controller 115 for internal storage or calculations, for example, related to the functions ascribed herein to the memory system controller 115. Additionally, or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally, or alternatively, a memory device 130 may include one or more arrays of volatile memory cells. For example, a memory device 130 may include RAM memory cells, such as DRAM memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally, or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programmed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be performed instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, L2P mapping tables may be maintained and data may be marked as valid or invalid at the page level of granularity, and a page 175 may contain valid data, invalid data, or no data. Invalid data may be data that is outdated due to a more recent or updated version of the data being stored in a different page 175 of the memory device 130. Invalid data may have been previously programmed to the invalid page 175 but may no longer be associated with a valid logical address, such as a logical address referenced by the host system 105. Valid data may be the most recent version of such data being stored on the memory device 130. A page 175 that includes no data may be a page 175 that has never been written to or that has been erased.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

The system 100 may include any quantity of non-transitory computer readable media that support memory device access techniques. For example, the host system 105, the memory system controller 115, or a memory device 130 (e.g., a local controller 135) may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

In some cases, the host system 105 may access information at one or more memory devices 130 of the memory system 110 by transmitting access commands to the memory system controller 115. In some cases, in response to each access command, the memory system controller 115 may send an RTT message to indicate a readiness to receive data from the host system controller 106. Sending an RTT message after each access command may increase latency at the system 100. Additionally, or alternatively, the memory system 110 may be unable to access memory at the host system 105, which may further reduce efficiency.

To improve efficiency and reduce latency at the system 100, the host system 105 and the memory system 110 may be configured to support device-controlled access to a portion of volatile memory. For example, the portion of volatile memory may be a portion of DRAM or SRAM located at the host system 105 or the memory system 110. For each access command, the host system 105 may assign the same memory resources (e.g., a PRDT) at the volatile memory. That is, multiple access commands may address a same location in the volatile memory at the host system 105. By assigning the same memory resources, the host system 105 may reduce a quantity of RTT messages sent by the memory system 110. For example, in some cases, the memory system 110 may send an RTT message after multiple access commands (e.g., a read command and write command pair), thereby reducing latency at the system 100.

FIG. 2 illustrates an example of a system 200 that supports memory device access techniques in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3D cross point, other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, upon completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. Upon receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine that an access command has been received based on the communication from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

Upon the determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine if the buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250. In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

Once the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250 and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, garbage collection, and the like). The entries may be added to the storage queue 270, e.g., by the memory system controller 215. The entries may be removed from the storage queue 270, e.g., by the storage controller 230 or memory system controller 215 upon completion of the transfer of the data.

To process a read command received from the host system 205, the memory system controller 215 may again first determine if the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed above with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, when the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed above. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the above operations in conjunction with or instead of the memory system controller 215. In some cases, the memory system controller 215 may perform the functions of the storage controller 230 and the storage controller 230 may be omitted.

In some cases, the host system 205 may access information at one or more memory devices 240 at the memory system 210 by transmitting access commands to the interface 220. For example, the interface 220 may be an example of a memory system controller as described with reference to FIG. 1. In some cases, in response to each access command, the interface 220 may send an RTT message to indicate a readiness to receive data from the host system 205. In some examples, based on the RTT message, the host system 205 may store a status of the memory system 210.

Sending an RTT message after each access command may increase latency at the system 200. Additionally, or alternatively, the memory system 210 may be unable to access memory at the host system 205, which may further reduce efficiency.

In order to improve efficiency and reduce latency at the system 200, the host system 205 and the memory system 210 may be configured to support device-controlled access to a portion of volatile memory. For example, the portion of volatile memory may be a portion of DRAM or SRAM located either at the host system 205 or the memory system 210. For example, one or more of the memory devices 240 may be a dedicated portion of volatile memory. For each access command, the host system 205 may assign the same memory resources (e.g., a PRDT) at the volatile memory. That is, multiple access commands may address a same location in the volatile memory, for example, at the host system 205. By assigning the same memory resources, the host system 205 may reduce a quantity of RTT messages sent by the memory system 210. For example, in some cases, the memory system 210 may send an RTT message in response to multiple access commands (e.g., a read command and write command pair), thereby reducing latency at the system 200.

FIG. 3 illustrates an example of a system 300 that supports memory device access techniques in accordance with examples as disclosed herein. The system 300 may be an example of a system 100 or a system 200 as described with reference to FIGS. 1 and 2. The system 300 may include a memory system 310 and a host system 305. The memory system 310 may include a controller 315 and a memory device 330-a configured to store data. The host system 305 may include a memory device 330-b configured to store data. The system 300 may support an interface for the host system 305 to transmit an access command 320 (e.g., an initiate command, a read command, or a write command) to the memory system 310 and receive a readiness indicator (e.g., an RTT message 325) from the memory system 310 in response to the access command 320. In some examples, the host system 305 may store a status of the memory system 310 (e.g., at the memory device 330-b) based on the RTT message 325.

The memory system 310 may include the controller 315 which may function as an interface between the host system 305 and memory system 310. The controller 315 may be an example of one or a combination of exemplary devices as described with reference to FIG. 2. For example, the controller 315 may be an example of an interface 220, a memory system controller 215, a storage controller 230, or a combination thereof. The memory system 310 may include a memory device 330-a, which may be an example of the memory devices described with reference to FIGS. 1 and 2. For example, the memory device 330-a may be non-volatile memory (e.g., NAND), or, in some cases may be volatile memory (e.g., DRAM). In some cases, the memory system 310 may include multiple memory devices 330, which may each be coupled with the controller 315.

The host system 305 may transmit one or more access commands 320, which may indicate operations to be performed by the memory system 310. The host system 305 may transmit the access commands 320 to the controller 315, and the controller 315 may decode the access commands 320 and access the relevant data stored in the memory device 330-a or forward the access commands 320 to the memory device 330-a (e.g., a local controller of the memory device 330-a). In some examples, a size of data associated with each access command 320 may be a maximum allowable size (e.g., 2 gigabytes (GB)), such as a maximum allowable size according to an industry standard specification (e.g., a UFS specification or a Non-Volatile Memory Express (NVMe) specification).

In some examples, the host system 305 may include a memory device 330-b. In some cases, the controller 315 may access the memory device 330-b at the host system 305 directly. For example, the memory device 330-b may be an example of SRAM or DRAM. The controller 315 at the memory system 310 may be configured to initiate a device-controlled access to the memory device 330-b, which may reduce the quantity of commands exchanged between the memory system 310 and the host system 305. For example, in some cases, the memory system 310 may send an indication of readiness to receive data (e.g., an RTT message 325) after receiving two access commands from the host system 305.

The memory device 330-b may include a list of memory resources (e.g., a PRDT) associated with one or more access commands 320. For example, the host system 305 may allocate the PRDT for a first access command 320. At a later time, the host system 305 may allocate the same PRDT for a second access command 320. That is, the first and second access commands 320 may address a same location in the memory device 330-b. In some cases, the PRDT may be located at the memory device 330-a. By allocating the same PRDT for two access commands 320, the memory system 310 may transmit a single RTT message 325 for the two access commands 320.

In some cases, the host system 305 may transmit an access command 320 to initiate a data transfer between the memory system 310 and the host system 305. In some cases, the host system 305 may transmit an access command 320 command to perform an access operation (e.g., a read operation of a write operation). The access command 320 may indicate a starting logical block address in the memory device 330-a and a quantity of contiguous logical blocks of data (e.g., a range, or set, of data) that are targeted for the corresponding access operation.

The controller 315 may receive and decode the access command 320 to identify the set of data. The controller 315, the memory system 310, the memory device 330-a, or any combination thereof, may perform the access operation. In some examples, the controller 315 may determine a readiness to receive data from the host system 305, and may transmit an RTT message 325 to the host system 305. In some cases, during the decoding of the access command 320, the controller 315 may determine whether there are errors in the set of data or not (e.g., whether the data is valid or not). In some examples, the controller 315 may transmit the RTT message 325 via a UFS protocol interface unit (UPIU). In some cases, the controller 315 may transmit the RTT message 325 after receiving a pair of access commands 320, rather than after each access command 320. The host system 305 may thereby receive the RTT message 325 indicating a readiness to receive data without initiating a read operation, which may reduce processing and latency.

Figure 4:
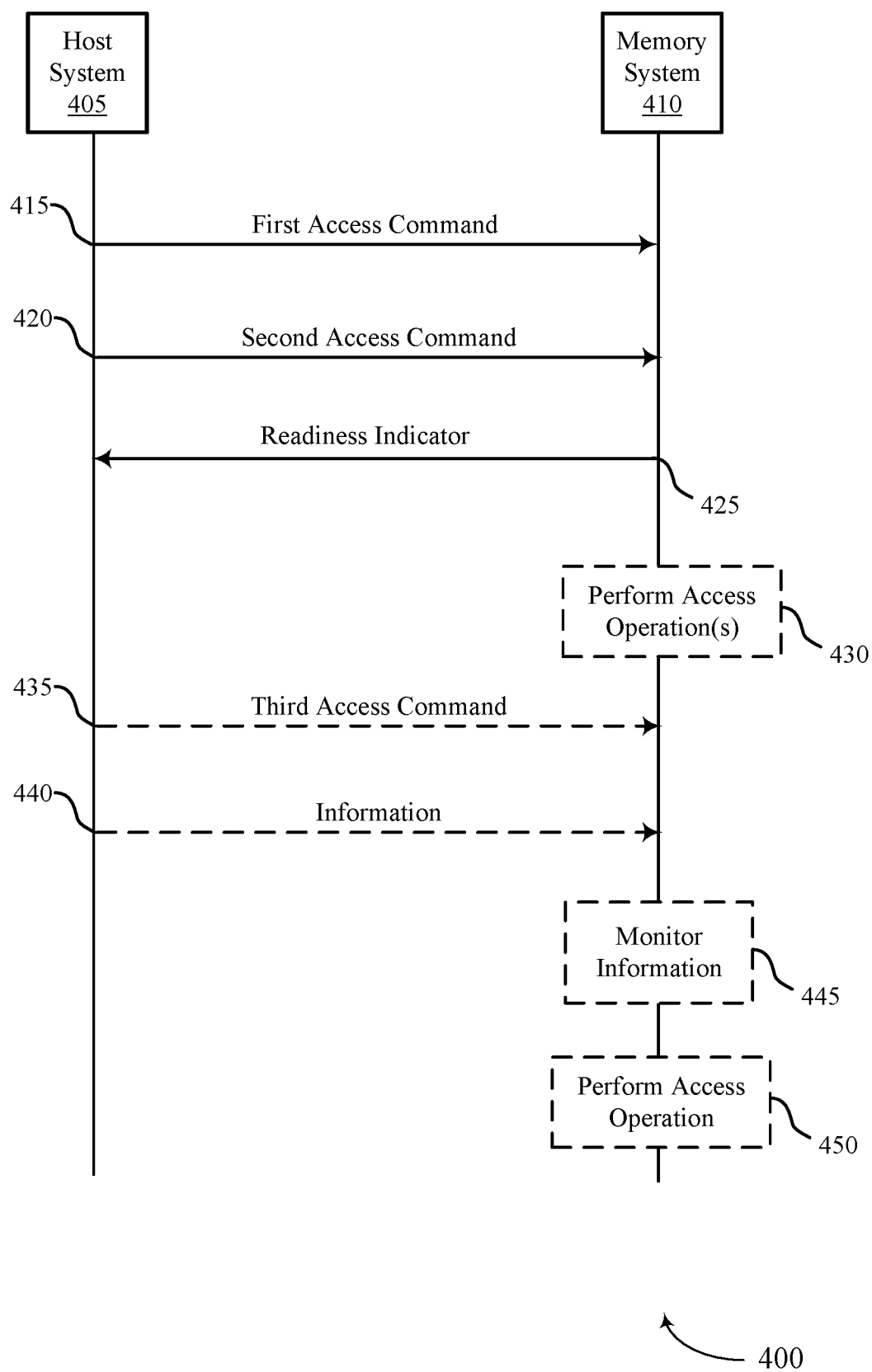
FIG. 4 illustrates an example of a process flow that supports memory device access techniques in accordance with examples as disclosed herein.

FIG. 4 illustrates an example of a process flow 400 that supports memory device access techniques in accordance with examples as disclosed herein. The process flow 400 may illustrate a process that may be implemented by a system 100 (or one or more components thereof), a system 200 (or one or more components thereof), or a system 300 (or one or more components thereof) as described with reference to FIGS. 1-3. The process flow 400 may illustrate a process for accessing a memory device.

Aspects of the process flow 400 may be implemented by one or more controllers, among other components (e.g., a memory system controller of a memory system 410, or a host system controller of a host system 405). Additionally, or alternatively, aspects of the process flow 400 may be implemented as instructions stored in memory (e.g., firmware stored in a memory coupled with the memory system 410). For example, the instructions, if executed by a controller, may cause the controller to perform the operations of the process flow 400. Alternative examples of the following may be implemented in which some operations are performed in a different order than described or are not performed at all. In some cases, operations may include features not mentioned below, or additional operations may be added.

At 415, a first access command may be transmitted to the memory system 410. For example, the host system 405 may transmit the first access command to the memory system 410. In some cases, the first access command may be an initiate command, a read command, or a write command. The first access command may be an example of a UPIU Memory Access (UMA) command. For example, the first access command may be an UMA_OPEN command, which may be an example of a read or write type command. An UMA_OPEN command may open the session (e.g., the data transfer between the memory system 410 and the host system 405) and may be used by the memory system 410 for tunneled access to the host system 405. For example, the UMA_OPEN command may enable access to the portion of volatile memory at the host system 405.

In some cases, the first access command may be an UMA_SUSPEND command, which may be an example of a write command. The UMA_SUSPEND command may be used to request that the memory system 410 close (e.g., complete) outstanding commands. For example, the UMA_SUSPEND command may trigger the memory system 410 to perform one or more access operations associated with previously-received commands. In some cases, an UMA_SUSPEND command may be replaced by a flag interface or an abort task request included in another command. In some cases, an initiate command may be an example of a UIC command. The host system 405 may allocate a portion of memory associated with the access command. For example, the host system 405 may allocate a PRDT (e.g., a scatter-gather list of memory resources) at a portion of volatile memory. In some cases, the PRDT may be located at a portion of volatile memory at the host system 405 or at the memory system 410.

At 420, a second access command may be transmitted to the memory system 410. For example, the host system 405 may transmit the second access command to the memory system 410. In some cases, the second access command may be a read command, or a write command. For example, the second access command may be an UMA_OPEN command, which may be an example of a read or write type command. In some examples, a size of data associated with each of the first and second access commands may be a maximum allowable size (e.g., 2 GB), such as a maximum allowable size according to an industry standard specification (e.g., a UFS specification or an NVMe specification).

The host system 405 may allocate a portion of memory associated with the second access command. In some cases, the host system 405 may allocate the same portion of memory as allocated for the first access command. That is, the first and second access commands may address a same memory location. For example, the host system 405 may allocate the PRDT at the same portion of volatile memory, either located at the memory system 410 or the host system 405.

At 425, a readiness indicator may be transmitted to the host system 405. For example, the memory system 410 may transmit the readiness indicator to the host system 405. The readiness indicator may be an example of an RTT message as described with reference to FIG. 3. In some examples, based on the readiness indicator, the host system 405 may store a status of the memory system 410. In some examples, the RTT message may be transmitted in response to a pair of access commands (e.g., the first access command received at 415, and the second access command received at 420). In some cases, the same PRDT being associated with both the first access command and the second access command may enable to memory system 410 to transmit a single RTT message for both access commands, rather than an RTT message for each command, thereby reducing latency.

In some examples, at 430, the memory system 410 may perform one or more access operations. For example, the memory system 410 may perform an access operation after indicating via the RTT message at 425 that it is ready to receive data. In some examples, the access operation may be performed in response to receiving the first access command at 415 or the receiving the second access command at 420. In some examples, the memory system 410 may perform more than one access operation at 430 (e.g., an access operation for each access command received before transmitting the readiness indicator at 425).

In some examples, at 435, a third access command may be transmitted to the memory system 410. For example, the host system 405 may transmit the third access command to the memory system 410. In some cases, the third access command may be a read command, or a write command. For example, the third access command may be an UMA_OPEN command, which may be an example of a read or write type command. In some examples, the third access command may be an UMA_SUSPEND command, which may be an example of a write command. In some cases, the third access command may be an UMA_CLOSE command, which may be an example of a write command. The UMA_CLOSE command may be used to request that the memory system 410 free up space in volatile memory (e.g., DRAM, SRAM) by transferring some information into non-volatile memory (e.g., NAND). For example, the UMA_CLOSE command may be used to guarantee that there may be contiguous space for future access commands in volatile memory. The host system 405 may allocate a portion of memory associated with the second access command. In some cases, the host system 405 may allocate the same portion of memory as allocated for the first access command and the second access command. For example, the host system 405 may allocate the PRDT at the same portion of volatile memory, either located at the memory system 410 or the host system 405.

In some examples, at 440, a quantity of information may be transferred to the memory system 410. For example, the host system 405 may transfer the quantity of information to the memory system 410. The information may be a list of memory resources associated with the first, second, or third access commands. For example, in some cases, the PRDT associated with the access commands may be located in volatile memory at the host system 405. In such cases, before the host system may power down, it may transfer the information at the PRDT into non-volatile memory at the memory system 410. For example, the host system may transfer the information to a memory device, as described with reference to FIG. 3. In such cases, the third access command may be an UMA_CLOSE command, which may trigger the transfer of information into non-volatile memory.

In some examples, at 445, the memory system 410 may monitor the information received from the host system 405. For example, the memory system 410 may receive information as part of the first, second, or third access commands. In some cases, the memory system 410 may receive information at 440 when the host system 405 transfers information into non-volatile memory. In some cases, the memory system 410 may have dedicated hardware for tracking the quantity of received information. The memory system 410 may monitor the received information to determine if the quantity satisfies a threshold. In some cases, the memory system 410 may determine that the host system 405 may expect a data transfer or access operation to be performed based on the monitoring. For example, the history of access commands and other information received may indicate a pattern of access operations to be performed.

In some examples, at 450, the memory system 410 may perform an access operation in response to monitoring the received information at 445. For example, the memory system 410 may perform the access operation without receiving an explicit command to do so, based on a history of information received from the host system 405. That is, the memory system 410 may anticipate when the host system 405 may expect an access operation to be performed. The access operation may be an example of a read or write command. In some examples, the access operation may be an example of an UMA_OPEN command, an UMA_SUSPEND command, or an UMA_CLOSE command as discussed herein.

Figure 5:
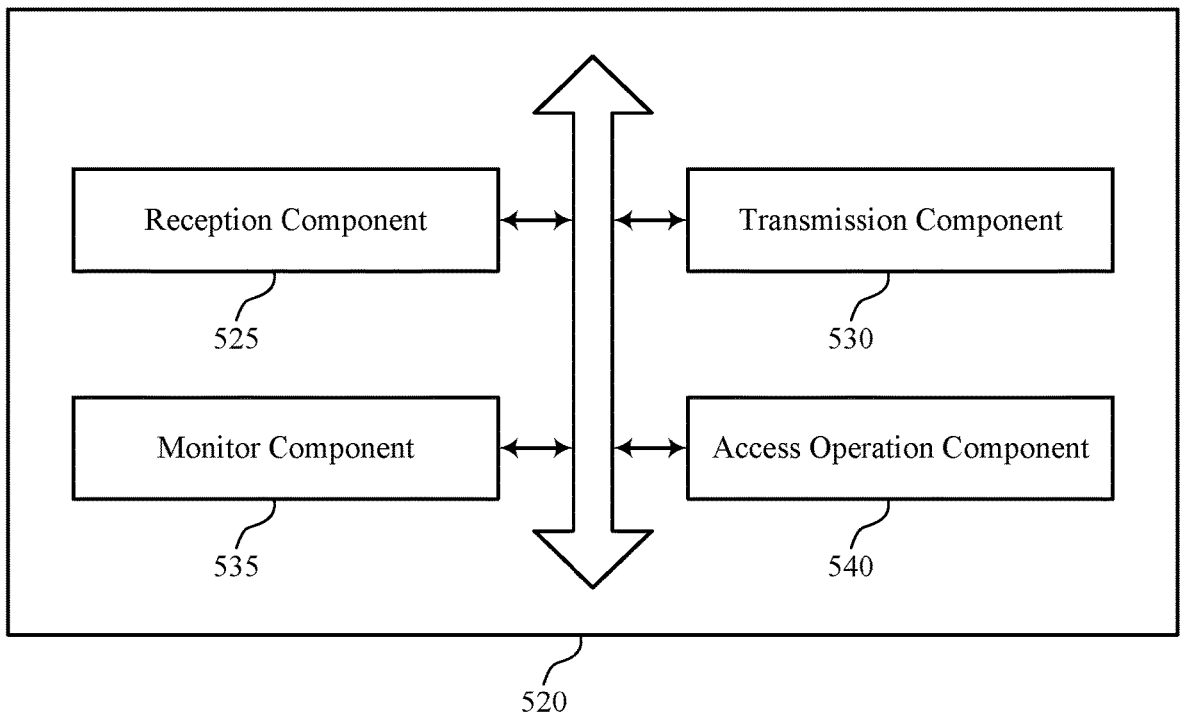
FIG. 5 shows a block diagram of a memory device that supports memory device access techniques in accordance with examples as disclosed herein.

FIG. 5 shows a block diagram 500 of a memory device 520 that supports memory device access techniques in accordance with examples as disclosed herein. The memory device 520 may be an example of aspects of a memory device as described with reference to FIGS. 1 through 4. The memory device 520, or various components thereof, may be an example of means for performing various aspects of memory device access techniques as described herein. For example, the memory device 520 may include a reception component 525, a transmission component 530, a monitor component 535, an access operation component 540, or any combination thereof. Each of these components may communicate, directly or indirectly, with one another (e.g., via one or more buses).

The reception component 525 may be configured as or otherwise support a means for receiving a first command to perform a first access operation. In some examples, the reception component 525 may be configured as or otherwise support a means for receiving, before transmitting a response to the first command, a second command to perform a second access operation. The transmission component 530 may be configured as or otherwise support a means for transmitting, in response to the first command and the second command, an indication of a readiness of a memory device to receive data.

In some examples, the first command includes a read command and the second command includes a write command.

In some examples, the reception component 525 may be configured as or otherwise support a means for receiving a third command to perform a third access operation, where the third command includes a write command.

In some examples, the reception component 525 may be configured as or otherwise support a means for receiving, based at least in part on receiving the third command, a list of memory resources.

In some examples, the reception component 525 may be configured as or otherwise support a means for receiving a plurality of commands, where each command of the plurality of commands includes a read command or a write command. In some examples, the transmission component 530 may be configured as or otherwise support a means for transmitting, in response to each pair of commands of the plurality of commands, a respective indication of the readiness of the memory device to receive data.

In some examples, the reception component 525 may be configured as or otherwise support a means for receiving, based at least in part on transmitting the indication, a quantity of data.

In some examples, the monitor component 535 may be configured as or otherwise support a means for monitoring the quantity of data received. In some examples, the access operation component 540 may be configured as or otherwise support a means for performing an access operation based at least in part on the quantity of data satisfying a threshold.

In some examples, the first command and the second command are associated with a logical address outside the memory device.

In some examples, the first command and the second command are associated with a same address of a memory.

In some examples, the first command and the second command are performed according to a first data mode or a second data mode. In some examples, the first data mode and the second data mode are associated with a reserved portion of a buffer.

In some examples, each of the first command and the second command includes one or more attributes, one or more flags, or any combination thereof, associated with a configuration of a volatile memory.

In some examples, the indication of the readiness includes a status of the memory device.

Figure 6:
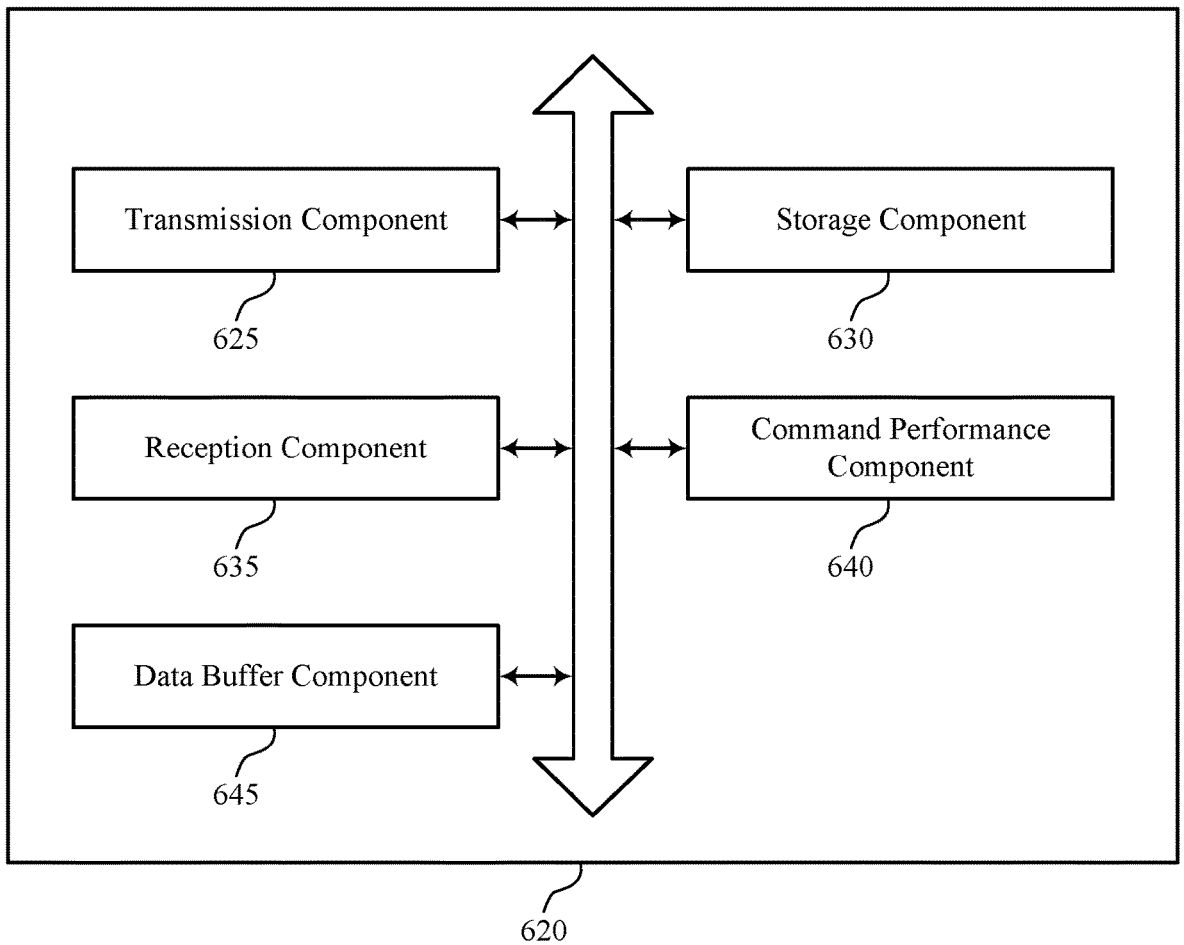
FIG. 6 shows a block diagram of a host device that supports memory device access techniques in accordance with examples as disclosed herein.

FIG. 6 shows a block diagram 600 of a host device 620 that supports memory device access techniques in accordance with examples as disclosed herein. The host device 620 may be an example of aspects of a host device as described with reference to FIGS. 1 through 4. The host device 620, or various components thereof, may be an example of means for performing various aspects of memory device access techniques as described herein. For example, the host device 620 may include a transmission component 625, a storage component 630, a reception component 635, a command performance component 640, a data buffer component 645, or any combination thereof. Each of these components may communicate, directly or indirectly, with one another (e.g., via one or more buses).

The transmission component 625 may be configured as or otherwise support a means for transmitting, to a memory device, a first command to perform a first access operation. The storage component 630 may be configured as or otherwise support a means for storing first information associated with the first command in a list of memory resources. In some examples, the transmission component 625 may be configured as or otherwise support a means for transmitting, to the memory device, a second command to perform a second access operation. In some examples, the storage component 630 may be configured as or otherwise support a means for storing second information associated with the second command in the list of memory resources. The reception component 635 may be configured as or otherwise support a means for receiving, at a host device in response to the first command and the second command, an indication of a readiness of the memory device to receive data.

In some examples, the list of memory resources is included in a physical region description table located at a portion of a volatile memory at the host device.

In some examples, the first command includes a read command and the second command includes a write command.

In some examples, the transmission component 625 may be configured as or otherwise support a means for transmitting, to the memory device, a third command to perform a third access operation, where the third command includes a write command. In some examples, the storage component 630 may be configured as or otherwise support a means for storing third information associated with the third command in the list of memory resources.

In some examples, the transmission component 625 may be configured as or otherwise support a means for transmitting, based at least in part on transmitting the third command, the list of memory resources to the memory device.

In some examples, the transmission component 625 may be configured as or otherwise support a means for transmitting, to the memory device, a plurality of commands, where each command of the plurality of commands includes a read command or a write command. In some examples, the reception component 635 may be configured as or otherwise support a means for receiving, in response to each pair of commands of the plurality of commands, an indication of the readiness of the memory device to receive data.

In some examples, the transmission component 625 may be configured as or otherwise support a means for transmitting, based at least in part on receiving the indication of the readiness to receive data, a quantity of data to the memory device.

In some examples, the first command and the second command are associated with a logical address outside the memory device.

In some examples, the first command and the second command are associated with a same address of a memory at the host device.

In some examples, the first command and the second command are performed according to a first data mode or a second data mode. In some examples, the first data mode and the second data mode are associated with a reserved portion of a buffer.

In some examples, each of the first command and the second command includes one or more attributes, one or more flags, or any combination thereof, associated with a configuration of a volatile memory at the host device.

In some examples, the indication of the readiness includes a status of the memory device.

Figure 7:
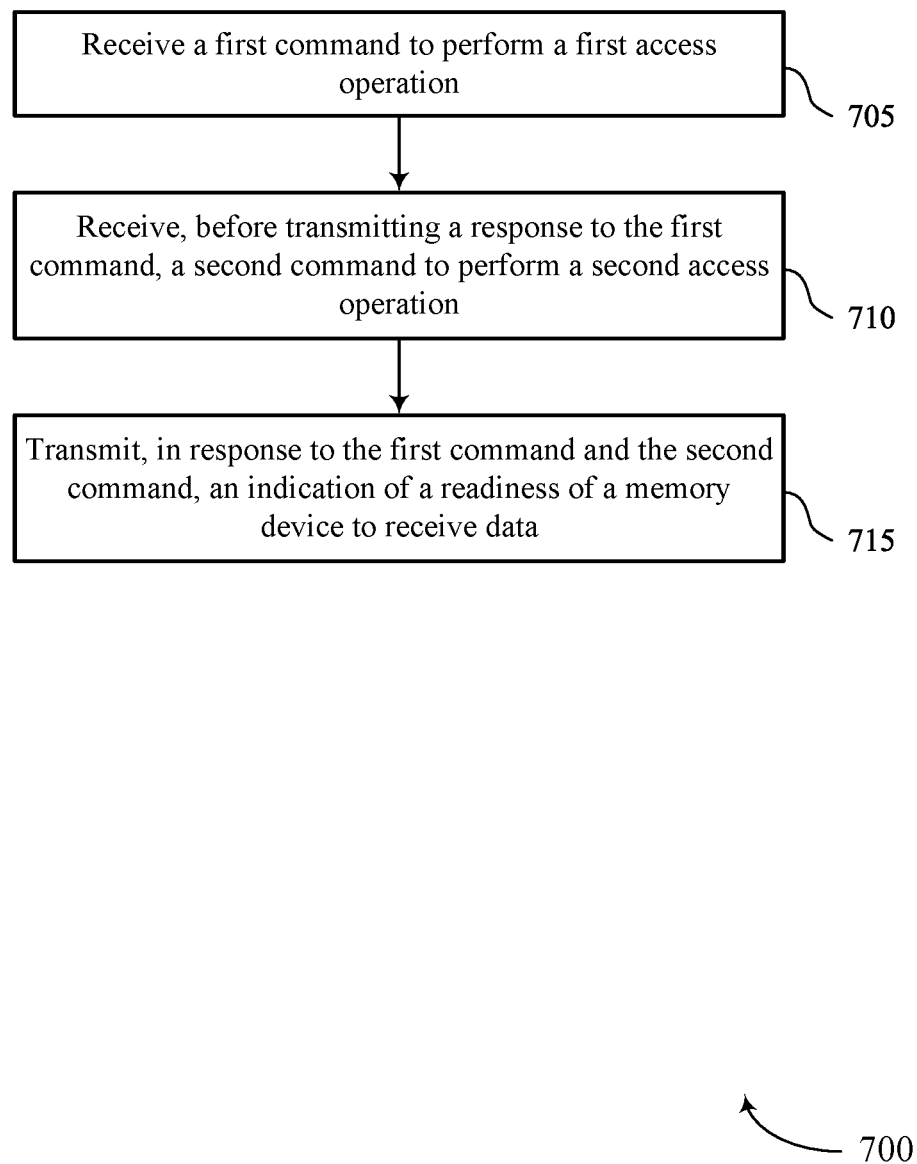
FIGS. 7 and 8 show flowcharts illustrating a method or methods that support memory device access techniques in accordance with examples as disclosed herein.

FIG. 7 shows a flowchart illustrating a method 700 that supports memory device access techniques in accordance with examples as disclosed herein. The operations of method 700 may be implemented by a memory device or its components as described herein. For example, the operations of method 700 may be performed by a memory device as described with reference to FIGS. 1 through 5. In some examples, a memory device may execute a set of instructions to control the functional elements of the device to perform the described functions. Additionally, or alternatively, the memory device may perform aspects of the described functions using special-purpose hardware.

At 705, the method may include receiving a first command to perform a first access operation. The operations of 705 may be performed in accordance with examples as disclosed herein. In some examples, aspects of the operations of 705 may be performed by a reception component 525 as described with reference to FIG. 5.

At 710, the method may include receiving, before transmitting a response to the first command, a second command to perform a second access operation. The operations of 710 may be performed in accordance with examples as disclosed herein. In some examples, aspects of the operations of 710 may be performed by a reception component 525 as described with reference to FIG. 5.

At 715, the method may include transmitting, in response to the first command and the second command, an indication of a readiness of a memory device to receive data. The operations of 715 may be performed in accordance with examples as disclosed herein. In some examples, aspects of the operations of 715 may be performed by a transmission component 530 as described with reference to FIG. 5.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving a first command to perform a first access operation; receiving, before transmitting a response to the first command, a second command to perform a second access operation; and transmitting, in response to the first command and the second command, an indication of a readiness of a memory device to receive data.

Aspect 2: The method, apparatus, or non-transitory computer-readable medium of aspect 1 where the first command includes a read command and the second command includes a write command.

Aspect 3: The method, apparatus, or non-transitory computer-readable medium of any of aspects 1 through 2, further including operations, features, circuitry, logic, means, or instructions, or any combination thereof for receiving a third command to perform a third access operation, where the third command includes a write command.

Aspect 4: The method, apparatus, or non-transitory computer-readable medium of aspect 3, further including operations, features, circuitry, logic, means, or instructions, or any combination thereof for receiving, based at least in part on receiving the third command, a list of memory resources.

Aspect 5: The method, apparatus, or non-transitory computer-readable medium of any of aspects 1 through 4, further including operations, features, circuitry, logic, means, or instructions, or any combination thereof for receiving a plurality of commands, where each command of the plurality of commands includes a read command or a write command and transmitting, in response to each pair of commands of the plurality of commands, a respective indication of the readiness of the memory device to receive data.

Aspect 6: The method, apparatus, or non-transitory computer-readable medium of any of aspects 1 through 5, further including operations, features, circuitry, logic, means, or instructions, or any combination thereof for receiving, based at least in part on transmitting the indication, a quantity of data.

Aspect 7: The method, apparatus, or non-transitory computer-readable medium of aspect 6, further including operations, features, circuitry, logic, means, or instructions, or any combination thereof for monitoring the quantity of data received and performing an access operation based at least in part on the quantity of data satisfying a threshold.

Aspect 8: The method, apparatus, or non-transitory computer-readable medium of any of aspects 1 through 7 where the first command and the second command are associated with a logical address outside the memory device.

Aspect 9: The method, apparatus, or non-transitory computer-readable medium of any of aspects 1 through 8 where the first command and the second command are associated with a with a same address of a memory.

Aspect 10: The method, apparatus, or non-transitory computer-readable medium of any of aspects 1 through 9 where the first command and the second command are performed according to a first data mode or a second data mode and the first data mode and the second data mode are associated with a reserved portion of a buffer.

Aspect 11: The method, apparatus, or non-transitory computer-readable medium of any of aspects 1 through 10 where each of the first command and the second command includes one or more attributes, one or more flags, or any combination thereof, associated with a configuration of a volatile memory.

Aspect 12: The method, apparatus, or non-transitory computer-readable medium of any of aspects 1 through 11 where the indication of the readiness comprises a status of the memory device.

Figure 8:
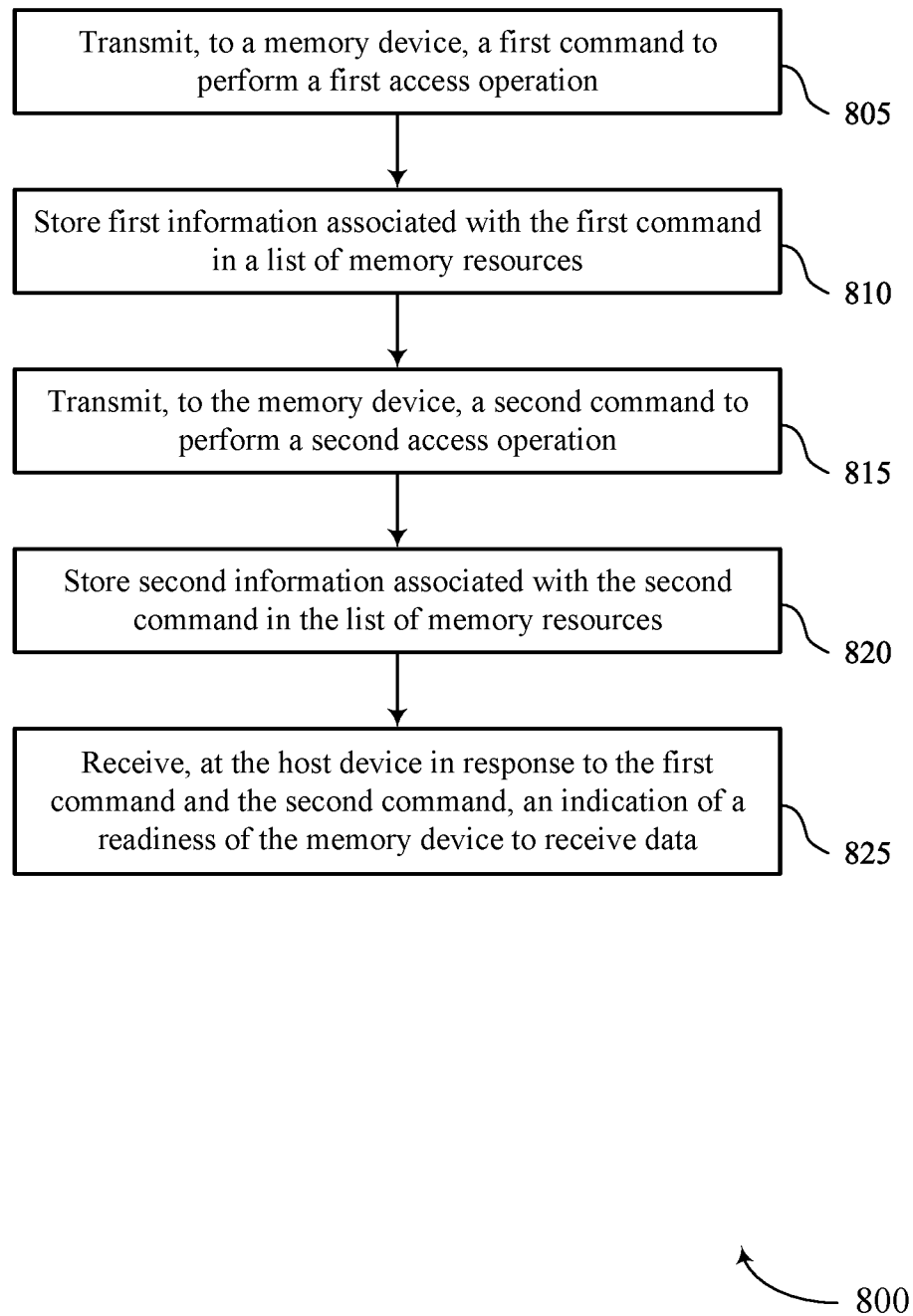

FIG. 8 shows a flowchart illustrating a method 800 that supports memory device access techniques in accordance with examples as disclosed herein. The operations of method 800 may be implemented by a host device or its components as described herein. For example, the operations of method 800 may be performed by a host device as described with reference to FIGS. 1 through 4 and 6. In some examples, a host device may execute a set of instructions to control the functional elements of the device to perform the described functions. Additionally, or alternatively, the host device may perform aspects of the described functions using special-purpose hardware.

At 805, the method may include transmitting, to a memory device, a first command to perform a first access operation. The operations of 805 may be performed in accordance with examples as disclosed herein. In some examples, aspects of the operations of 805 may be performed by a transmission component 625 as described with reference to FIG. 6.

At 810, the method may include storing first information associated with the first command in a list of memory resources. The operations of 810 may be performed in accordance with examples as disclosed herein. In some examples, aspects of the operations of 810 may be performed by a storage component 630 as described with reference to FIG. 6.

At 815, the method may include transmitting, to the memory device, a second command to perform a second access operation. The operations of 815 may be performed in accordance with examples as disclosed herein. In some examples, aspects of the operations of 815 may be performed by a transmission component 625 as described with reference to FIG. 6.

At 820, the method may include storing second information associated with the second command in the list of memory resources. The operations of 820 may be performed in accordance with examples as disclosed herein. In some examples, aspects of the operations of 820 may be performed by a storage component 630 as described with reference to FIG. 6.

At 825, the method may include receiving, at the host device in response to the first command and the second command, an indication of a readiness of the memory device to receive data. The operations of 825 may be performed in accordance with examples as disclosed herein. In some examples, aspects of the operations of 825 may be performed by a reception component 635 as described with reference to FIG. 6.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 13: A method, apparatus, or non-transitory computer-readable medium including operations, features, circuitry, logic, means, or instructions, or any combination thereof for transmitting, to a memory device, a first command to perform a first access operation; storing first information associated with the first command in a list of memory resources; transmitting, to the memory device, a second command to perform a second access operation; storing second information associated with the second command in the list of memory resources; and receiving, at a host device in response to the first command and the second command, an indication of a readiness of the memory device to receive data.

Aspect 14: The method, apparatus, or non-transitory computer-readable medium of aspect 13 where the list of memory resources is included in a physical region description table located at a portion of a volatile memory at the host device.

Aspect 15: The method, apparatus, or non-transitory computer-readable medium of any of aspects 13 through 14 where the first command includes a read command and the second command includes a write command.

Aspect 16: The method, apparatus, or non-transitory computer-readable medium of any of aspects 13 through 15, further including operations, features, circuitry, logic, means, or instructions, or any combination thereof for transmitting, to the memory device, a third command to perform a third access operation, where the third command includes a write command and storing third information associated with the third command in the list of memory resources.

Aspect 17: The method, apparatus, or non-transitory computer-readable medium of aspect 16, further including operations, features, circuitry, logic, means, or instructions, or any combination thereof for transmitting, based at least in part on transmitting the third command, the list of memory resources to the memory device.

Aspect 18: The method, apparatus, or non-transitory computer-readable medium of any of aspects 13 through 17, further including operations, features, circuitry, logic, means, or instructions, or any combination thereof for transmitting, to the memory device, a plurality of commands, where each command of the plurality of commands includes a read command or a write command and receiving, in response to each pair of commands of the plurality of commands, an indication of the readiness of the memory device to receive data.

Aspect 19: The method, apparatus, or non-transitory computer-readable medium of any of aspects 13 through 18, further including operations, features, circuitry, logic, means, or instructions, or any combination thereof for transmitting, based at least in part on receiving the indication of the readiness to receive data, a quantity of data to the memory device.

Aspect 20: The method, apparatus, or non-transitory computer-readable medium of any of aspects 13 through 19 where the first command and the second command are associated with a logical address outside the memory device.

Aspect 21: The method, apparatus, or non-transitory computer-readable medium of any of aspects 13 through 20 where the first command and the second command are associated with a same address of a memory at the host device.

Aspect 22: The method, apparatus, or non-transitory computer-readable medium of any of aspects 13 through 21 where the first command and the second command are performed according to a first data mode or a second data mode and the first data mode and the second data mode are associated with a reserved portion of a buffer.

Aspect 23: The method, apparatus, or non-transitory computer-readable medium of any of aspects 13 through 22 where each of the first command and the second command includes one or more attributes, one or more flags, or any combination thereof, associated with a configuration of a volatile memory at the host device.

Aspect 24: The method, apparatus, or non-transitory computer-readable medium of any of aspects 13 through 23 where the indication of the readiness comprises a status of the memory device.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a controller associated with a memory device, wherein the controller is configured to cause the apparatus to:
receive a first command to perform a first access operation;
receive, before transmitting a response to the first command, a second command to perform a second access operation; and
transmit, in response to the first command and the second command, an indication of a readiness of the memory device to receive data.

2. The apparatus of claim 1, wherein the first command comprises a read command and the second command comprises a write command.

3. The apparatus of claim 1, wherein the controller is further configured to cause the apparatus to:
receive a third command to perform a third access operation, wherein the third command comprises a write command.

4. The apparatus of claim 3, wherein the controller is further configured to cause the apparatus to:
receive, based at least in part on receiving the third command, a list of memory resources.

5. The apparatus of claim 1, wherein the controller is further configured to cause the apparatus to:
receive a plurality of commands, wherein each command of the plurality of commands comprises a read command or a write command; and
transmit, in response to each pair of commands of the plurality of commands, a respective indication of the readiness of the memory device to receive data.

6. The apparatus of claim 1, wherein the controller is further configured to cause the apparatus to:
receive, based at least in part on transmitting the indication, a quantity of data.

7. The apparatus of claim 6, wherein the controller is further configured to cause the apparatus to:
monitor the quantity of data received; and
perform an access operation based at least in part on the quantity of data satisfying a threshold.

8. The apparatus of claim 1, wherein the first command and the second command are associated with a logical address outside the memory device.

9. The apparatus of claim 1, wherein the first command and the second command are associated with a same address of a memory.

10. The apparatus of claim 1, wherein:
the first command and the second command are performed according to a first data mode or a second data mode; and
the first data mode and the second data mode are associated with a reserved portion of a buffer.

11. The apparatus of claim 1, wherein each of the first command and the second command comprises one or more attributes, one or more flags, or any combination thereof, associated with a configuration of a volatile memory.

12. The apparatus of claim 1, wherein the indication of the readiness comprises a status of the memory device.

13. An apparatus, comprising:
a controller associated with a host device, wherein the controller is configured to cause the apparatus to:
transmit, to a memory device, a first command to perform a first access operation;
store first information associated with the first command in a list of memory resources;
transmit, to the memory device, a second command to perform a second access operation;
store second information associated with the second command in the list of memory resources; and
receive, at the host device in response to the first command and the second command, an indication of a readiness of the memory device to receive data.

14. The apparatus of claim 13, wherein the list of memory resources is included in a physical region description table located at a portion of a volatile memory at the host device.

15. The apparatus of claim 13, wherein the first command comprises a read command and the second command comprises a write command.

16. The apparatus of claim 13, wherein the controller is further configured to cause the apparatus to:
transmit, to the memory device, a third command to perform a third access operation, wherein the third command comprises a write command; and
store third information associated with the third command in the list of memory resources.

17. The apparatus of claim 16, wherein the controller is further configured to cause the apparatus to:
transmit, based at least in part on transmitting the third command, the list of memory resources to the memory device.

18. The apparatus of claim 13, wherein the controller is further configured to cause the apparatus to:
transmit, to the memory device, a plurality of commands, wherein each command of the plurality of commands comprises a read command or a write command; and
receive, in response to each pair of commands of the plurality of commands, an indication of the readiness of the memory device to receive data.

19. The apparatus of claim 13, wherein the controller is further configured to cause the apparatus to:
transmit, based at least in part on receiving the indication of the readiness to receive data, a quantity of data to the memory device.

20. The apparatus of claim 13, wherein the first command and the second command are associated with a logical address outside the memory device.

21. The apparatus of claim 13, wherein the first command and the second command are associated with a same address of a memory at the host device.

22. The apparatus of claim 13, wherein:
the first command and the second command are performed according to a first data mode or a second data mode; and
the first data mode and the second data mode are associated with a reserved portion of a buffer.

23. The apparatus of claim 13, wherein each of the first command and the second command comprises one or more attributes, one or more flags, or any combination thereof, associated with a configuration of a volatile memory at the host device.

24. The apparatus of claim 13, wherein the indication of the readiness comprises a status of the memory device.

25. A non-transitory computer-readable medium storing code, the code comprising instructions executable by a processor to:
receive a first command to perform a first access operation;
receive, before transmitting a response to the first command, a second command to perform a second access operation; and transmit, in response to the first command and the second command, an indication of a readiness of a memory device to receive data.

\* \* \* \* \*